United States Patent [15] 3,688,304

Rasch [45] Aug. 29, 1972

[54] ARRANGEMENT FOR CODING GIVEN PATHLENGTHS IN OUTGOING ELECTRICAL SIGNALS

[72] Inventor: Eugen Rasch, Koeln-Worringen, Germany

[73] Assignee: Erdolchemie Gesellschaft mit beschrankter Haftungs, Cologne, Germany

[22] Filed: Oct. 12, 1970

[21] Appl. No.: 79,969

Related U.S. Application Data

[63] Continuation-in-part of Ser. No. 843,117, July 18, 1969, abandoned.

[30] Foreign Application Priority Data

Aug. 6, 1968 Germany..........P 17 73 999.0

[52] U.S. Cl...............................................340/347 P
[51] Int. Cl...............................................G08c 9/08
[58] Field of Search...................340/347, 347 P, 271

[56] References Cited

UNITED STATES PATENTS

| | | | |
|---|---|---|---|
| 3,165,731 | 1/1965 | Spaulding | ..............340/347 P |
| 2,873,440 | 2/1959 | Speller | ....................340/347 P |
| 2,873,442 | 2/1959 | Ziserman | ................340/347 P |
| 3,156,911 | 11/1964 | Ziserman | ................340/347 P |
| 3,284,793 | 11/1966 | Smith | ......................340/347 P |
| 3,484,780 | 12/1969 | Kamoi et al. | ...........340/347 P |

FOREIGN PATENTS OR APPLICATIONS

| | | | |
|---|---|---|---|
| 930,412 | 7/1963 | Great Britain | .............340/347 |

OTHER PUBLICATIONS

C. P. Spaulding " How to Use Shaft Encoders" C. 1965, pg. 24– 25

*Primary Examiner*—Maynard R. Wilbur
*Assistant Examiner*—Charles D. Miller
*Attorney*—Burgess, Dinklage & Sprung

[57] ABSTRACT

Apparatus for converting the values of a variable parameter, such as pneumatic pressure, into corresponding unique electrical signals comprising a plurality of contacts. A movable member is engageable with the plurality of contacts and is adapted to apply a potential thereto. Converting means to provide which is responsive to the variable parameter for converting the value of the parameter into a corresponding position of the movable member. Circuit means is connected with the plurality of contacts for producing a different electrical signal in response to the respective engagement of each one of said plurality of contacts by the movable member. The circuit means includes a blocking circuit for blocking all but one of the electrical signals produced in response to the movable member simultaneously engaging more than one of the plurality of contacts thereby insuring that only one unique electrical signal will be generated for each value of the parameter.

2 Claims, 1 Drawing Figure

PATENTED AUG 29 1972
3,688,304
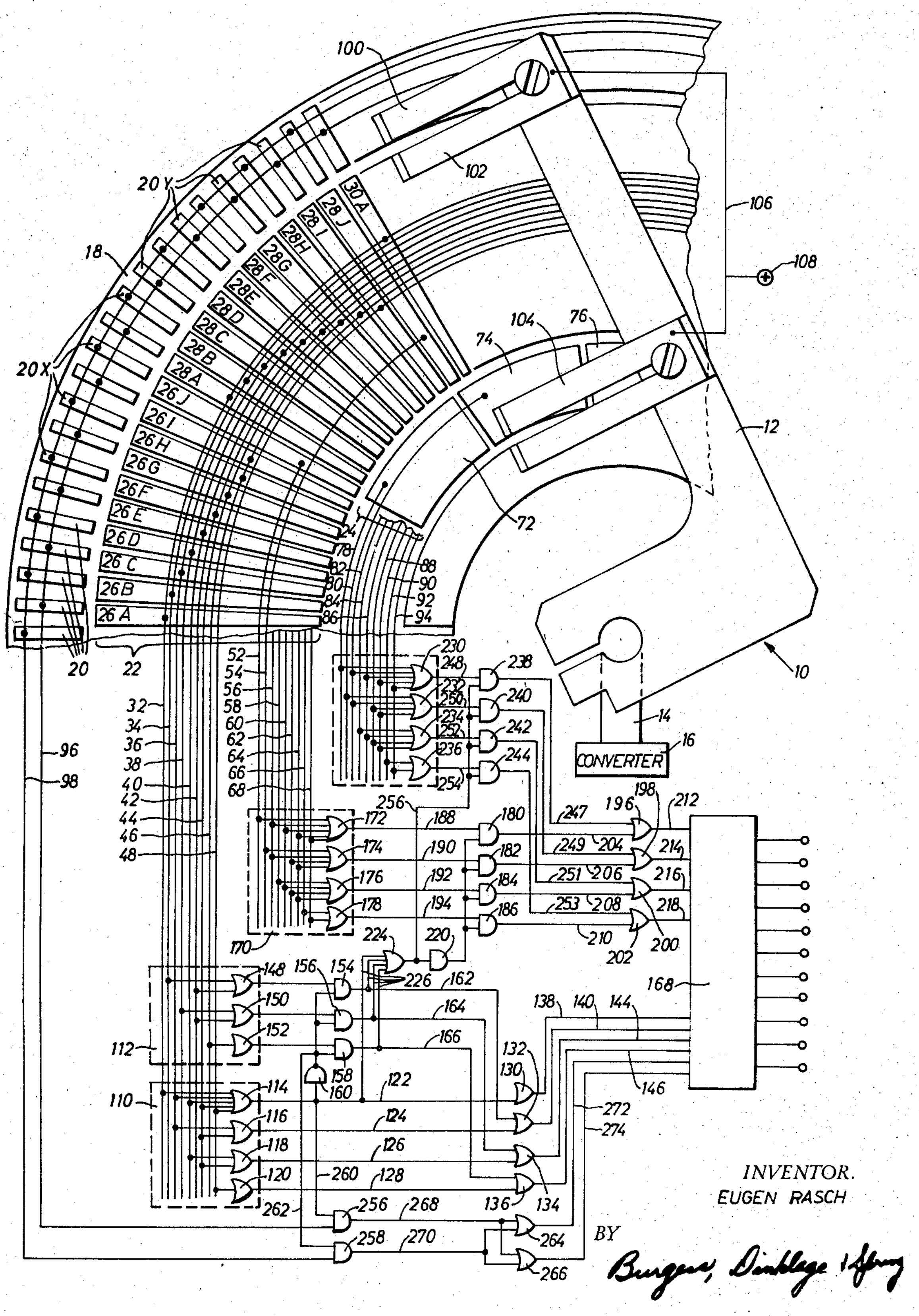
INVENTOR.
EUGEN RASCH
BY Burgess, Dinklage & Sprung

ARRANGEMENT FOR CODING GIVEN PATHLENGTHS IN OUTGOING ELECTRICAL SIGNALS

This application is a continuation-in-part of my copending application, Ser. No. 843,117, filed July 18, 1969, now abandoned, entitled "Arrangement For Coding Given Pathlengths In Outgoing Electrical Signals".

The present invention relates generally to apparatus for converting a variable parameter into unique electrical signals, and, more particularly, pertains to an apparatus which is operable to convert the position of a movable member into a corresponding numerical value.

In the chemical industry, for example, measured values are frequently represented by pneumatic pressures. In many applications, these pneumatic pressures must be represented on a recording medium which is positioned at a location remote from the location where such measurements are taken. Presently, this is accomplished by first converting the pneumatic signal into an analogous electrical value and then applying this electrical value into an analog-to-digital converter. The converter produces a signal in digital form at the output which can then be processed electronically.

The above type of method has various disadvantages associated with its use. Due to the repeated encoding and subsequent decoding, considerable inaccuracies may occur by summation of the errors of the individual devices. An accuracy of 0.5 percent can frequently only be achieved by the use of considerable material outlay and hence financial expenditure.

Accordingly, an object of the present invention is to provide an improved apparatus for converting a variable parameter into unique electrical signals.

A more specific object of the invention is to provide an apparatus for converting the values of a variable parameter, such as pneumatic pressures, into unique electrical signals which is reliable in operation and economical to implement.

Another object of the invention resides in the novel details of the circuitry which provide an apparatus of the type described wherein the apparatus includes a blocking arrangement for eliminating any possible errors in the signals produced.

Accordingly, an apparatus for converting the values of a variable parameter into corresponding unique electrical signals constructed in accordance with the present invention comprises a plurality of contacts. A movable member is engagable with the plurality of contacts and is adapted to apply a potential thereto. Converting means responsive to the variable parameter for converting the value of the parameter into a corresponding position of the movable member is provided and circuit means is connected with the plurality of contacts for producing a different electrical signal as each one of the contacts is engaged by the movable member. The circuit means includes blocking means for blocking all but one of the signals produced in response to the movable member simultaneously engaging more than one of the plurality of contacts.

Other features and advantages of the present invention will become more apparent from a consideration of the following detailed description when taken in conjunction with the accompanying drawing, wherein the single FIGURE is a partial schematic and diagrammatic representation of an apparatus constructed according to the present invention.

In the description of the apparatus of the present invention which follows hereinbelow, it will be assumed that the apparatus is utilized to monitor the pressure variations of an associated device. Moreover, these pressure variations will be described as being converted into electrical signals representative of a binary coded decimal code. In other words, the pressure variations are converted into conventional decimal quantities having a radix of 10, and these quantities will be represented by a binary code. Additionally, these decimal quantities are described as representing a percentage of the overall pressure in the system. Hence, if the maximum pressure to be measured is known, the absolute pressure at any point in time may be calculated by multiplying the maximum pressure by the percentage indicated by the apparatus of the present invention. The apparatus will further be described as measuring the pressure in 0.5 percent steps. However, it is to be noted that the above examples are only illustrative of the apparatus of the present invention and are not to be interpreted as being a limitation thereon. That is, the apparatus may be utilized to measure any variable parameter and to convert the values of the parameter into unique electrical signals corresponding to each value of the parameter. Moreover, the apparatus need not be limited to producing signals representative of percentages of the parameter but may be adapted to read out the value of the parameter directly.

Accordingly, an apparatus constructed according to the present invention is designated generally by the reference numeral 10 in the FIGURE and includes an arm 12 connected to a shaft 14. The shaft 14 is connected to a converter 16 which is operable to convert the parameter to be measured into a corresponding rotation of the shaft 14. That is, in the example under consideration, the quantity to be measured is the pressure of an associated device. Accordingly, the converter 16 is operable to convert the value of the pressure at any point in time into a corresponding angular movement of the arm 12. Thus, the converter 16 may comprise a pressure responsive bellows connected to an appropriate linkage for causing rotation of the shaft 14. It will be obvious that the position or the angular movement of the arm 12 from a rest or zero position will be proportional to the value of the pressure to be monitored.

Positioned below the arm 12 is a contact plate 18 having three groups of contacts respectively designated 20, 22 and 24. As noted in greater detail below, the group 22 of contacts represent unit percentage increases in the quantity measured; the group 24 of contacts represent decade percentage increments of the quantity measured; and, the group 20 of contacts represent half-unit percentage increases in the quantity measured. Accordingly, in practice, 200 contacts 20 are provided, 100 contacts 22 are provided and 10 contacts 24 are provided. Moreover, as shown in the figure, the groups 20, 22 and 24 of contacts are arranged concentrically with respect to the shaft 14 in decreasing radial order. That is, the group 24 of contacts is closest to the shaft 14 whereas the group 20 of contacts is furthest from the shaft 14.

The unit group 22 of contacts may be thought of as comprising 10 sets of 10 contacts each. That is, the first set of contacts comprising the group 22 is designated 26A–26J and correspond to unit increments 1–10 in the example under consideration. The second set of contacts in the group 22 are designated 28A–28J and correspond to the unit increments 11–20, and so on. Each of the A contacts in the group 22 are connected together by a lead 32. All of the B contacts in the group 22 are connected together by a lead 34. Similar comments apply to all of the C through I contacts which are respectively connected together by the leads 36–48. The J contacts, which represent the transition from one decade to the next, are connected to individual leads. That is, the contact 26J which corresponds to the unit increment 10 is connected to a lead 52. The contact 28J which corresponds to the unit increment 20 is connected to a lead 54. Similar comments apply to the J contacts in each set of contacts comprising the group 22 which are respectively connected to leads 56–68.

As noted above, the group 24 of contacts comprises 10 segments of which segments 72, 74 and 76 are shown. The contact segments comprising the group 24 subtend the same arc as subtended by 10 of the unit segments comprising the group 22. Thus, for example, the contact segment 72 extends substantially from the contact 26J to the contact 28I. Moreover, the leading edge of the contact 72 is spaced slightly behind the leading edge of the contact 26J for reasons which will become apparent hereinbelow. Each one of the 10 contact segments comprising the group 24 is connected to a respective one of the leads 78–94.

The group 20 of contacts may be thought of as comprising 100 sets of two contacts each. Moreover, it will be apparent that each set of two contacts in the group 20 will be associated with one of the contacts in each set comprising the group 22. Alternate contacts in the group 20 are connected together by lead 96 whereas the other alternate ones in the group 20 of contacts are connected together by a lead 98.

An electrical potential is adapted to be applied to the contacts on the contact plate 18 by the arm 12. More specifically, the arm 12, which may be fabricated from an insulating material, mounts conducting brushes 100, 102, and 104. Connected to the brushes 100–104 by a lead 106 is the positive terminal of a source of potential 108, the other terminal of which may be grounded. The brush 100 is positioned to engage the contacts comprising the group 20, the brush 102 is positioned to engage the contacts comprising the group 22, and the brush 104 is positioned to engage the contacts comprising the group 24. Thus, it will be obvious that as the brushes wipe across the contacts a positive signal will be applied to those contacts which the brushes engage.

In order to provide an apparatus wherein a signal is always present at the output thereof, the brushes 100–102 and the contacts on the contact plate 18 are positioned so that the brushes will engage the succeeding contact before leaving the preceding contact. In other words, the brushes perform a so-called make-before-break engagement with the contacts.

In view of the fact that a brush can simultaneously engage two contacts, it will be obvious that a possibility exists that two signals may be produced each representing a different value of the monitored parameter corresponding to the engagement of the brush with the two contact segments. Accordingly, a feature of the present invention is to provide a circuit arrangement wherein only one signal is produced indicative of the engagement of a corresponding contact with the brush even though the brush may simultaneously engage two such contacts. This arrangement will become more apparent from the description of the circuit elements below.

In accordance with the invention, the contacts in each set of contacts comprising the group 22 are respectively divided into odd and even contacts. More specifically, the A, C, E, G and I contacts representing the units one, three, five, seven and nine respectively are connected together in a matrix 110. On the other hand, the B, D, F, and H contacts representing the even numbered contacts in each set of contacts comprising the group 22 are connected together in a matrix 112.

To be more specific, the matrix 110 includes four OR gates 114–120. The input terminals of OR gate 114 are connected to leads 32, 36, 40, 44 and 48. The input terminals of the OR gate 116 are connected to leads 36 and 44. The input terminals of the OR gate 118 are connected to leads 40 and 44. The input terminal of the OR gate 120 is connected to lead 48. The output terminals of OR gates 114–120 are connected to respective leads 122–128 which connected, in turn, to one input terminal of respective OR gates 130–136. Respective leads 138–146 are connected to the output terminals of the OR gates 130–136.

A consideration of the circuit described above will reveal that the output signal appearing on the leads 138–146 will represent the particular unit contact in engagement with the brush 102 in binary code. That is, if the brush 102 is in engagement with the contact 26A representing the one unit, a signal will be applied to lead 32 and thereby to the input terminal of the OR gate 114. Hence, the output lead 138 will carry a signal via the lead 122 and the OR gate 130 thereby indicating the unit one in binary code. If, on the other hand, the brush 102 is in engagement with the contact 26G corresponding to the seventh unit, the positive signal from the source 108 will be applied to the lead 44 connected to the contact 26G. Accordingly, one input terminal of OR gates 114, 116 and 118 (each of which are connected to the lead 44) will be energized thereby causing a signal to appear on the leads 138, 140 and 144. Thus, it will be obvious that a signal appearing on these three leads will represent the decimal digit seven in binary code.

The even number matrix 112 includes OR gates 148–152. The input terminals of the OR gate 148 are connected to leads 34 and 42. The input terminals of the OR gate 150 are connected to leads 38 and 42. The input terminal of the OR gate 152 is connected to lead 46. The output terminals of the OR gates 148–152 are respectively connected to one input terminal of AND gates 154–158. The other input terminal of each of the AND gates 154–158 are connected together and to the output terminal of a NAND gate 160, the input terminal of which is connected to the lead 122. The output terminals of the AND gates 154–158 are respectively connected to an input terminal of OR gates 132–136 by respective leads 162–166. Accordingly, it will now be obvious that if any signals appear on the leads 162–166 corresponding to the engagement of the brush 102 with a contact representing an even unit number, that particular number will be represented in binary code by appropriate combinations of signals on leads 138–146.

For example, if it is assumed that the brush 102 is in engagement with contact 26H corresponding to the unit number eight, the lead 46 will be energized thereby applying a signal to the OR gate 152. Assuming that an appropriate positive signal is applied to the other input terminal of the AND gate 158, a positive signal will be applied to the lead 166 thereby causing an output signal to appear on the lead 146 which represents the digit eight in binary code. The leads 138–146 may be connected to an appropriate binary to decimal encoder 168 which is operable to produce a signal representative of the decimal digit represented by the binary encoded signals applied to the input thereof to produce a representation of the unit value of the parameter which is being measured.

As noted hereinabove, the apparatus of the present invention is operable to eliminate any errors in the system by producing only one output signal albeit the make-before-break engagement of the brush with the contacts causes the brush to engage two contacts simultaneously. Accordingly, it will be noted that with no input signal applied to the OR gate 114 in the matrix 110, the output signal produced by the NAND gate 160 will be positive thereby enabling AND gates 154–158. Accordingly, if the brush 102 is in engagement with any of the even numbered unit contacts in any set of the contacts comprising the group 22, a signal will appear on the appropriate one of the leads 162–166 to cause the binary representation of the corresponding decimal quantity to be produced. However, if the brush 102 is in contact with any one of the contacts in a set of contacts of the group 22 representing an odd number, an input signal will be applied to the OR gate 114 thereby causing an input signal to be applied to the NAND gate 160 via the lead 122. Thus a negative or zero signal will appear at the output of the NAND gate 160 thereby disabling the AND gates 154–158 so that no signals can pass therethrough. Moreover, since each contact representing an even number is adjacent a contact representing an odd number, it will be obvious that if the brush 102 spans two contacts in the group 22 at the same time, the gates 154–158 will be disabled. Accordingly, only a binary coded signal which represents an odd number will appear on the output leads 138–146 when the brush 102 engages two adjacent contacts. Thus any errors in the system are completely eliminated by the apparatus of the present invention. However, it should be noted that the connection of the AND gates 154–158 to the matrix 112 is for illustrative purposes only. That is, the AND gates may be associated with the matrix 110 in which case an even number would appear on the output leads 138–146 when the brush 102 spans two contacts.

The J contact in each set of contacts comprising the group 22 is connected to a matrix designated generally by the reference numeral 170. The matrix 170 includes OR gates 172–178. The input terminals of the OR gate 172 are connected to the respective leads 52, 56, 60, 64 and 68. The input terminals of the OR gate 174 are connected to the respective leads 54, 56, 62 and 64. The input terminals of the OR gate 176 are connected to the respective leads 58–64. The input terminals of the OR gate 178 are connected to the respective leads 66 and 68. The output terminals of the OR gates 172–178 are connected to an input terminal of AND gates 180–186, respectively, by the respective leads 188–194. The output terminals of the AND gates 180–186 are connected to input terminals of respective OR gates 196–202 by leads 204–210, respectively. The output terminals of the OR gates 196–202 are connected to respective leads 212–218. The signals on leads 212–218 represent the decade value of the parameter which is being monitored or measured in binary code. As an example, a signal appearing on the lead 212 indicates that the decade value of the pressure is 10 in binary code whereas signals appearing on the respective leads 212 and 216 indicate the decade value 50 in binary notation. The leads 212–218 may be connected to the binary to decimal encoder 168 so the encoder 168 will produce the correct decimal notation of the value of the pressure which is being monitored at the output terminals thereof, in the conventional manner. That is, the encoder 168 is operable to encode the decade signals appearing on the leads 212–218 and the unit signals appearing on the leads 138–146 to produce at the output thereof an indication of the total pressure in a quantity having the radix 10. For example, signals appearing on the leads 212 and 144 will be encoded as the decimal quantity 14.

The other output terminal of each of the AND gates 180–186 are connected to the output terminal of a NAND gate 220 by a lead 222. The input terminal of the NAND gate 220 is connected to the output terminal of an OR gate 224 the input terminals of which are connected to the leads 162–166 and the lead 122 by leads 226. The gates 224, 220 and 180–186 eliminate any errors which may be produced due to multiple signals in the manner indicated below.

The decade contacts comprising the group 24 are connected to a matrix designated generally by the reference numeral 228. The matrix 228 includes OR gates 230–236. The input terminals of the OR gate 230 are connected to the leads 78, 82, 86, 90 and 94. The input terminals of the OR gate 232 are connected to the leads 80, 82, 88 and 90. The input terminals to the OR gate 234 are connected to the leads 84, 86, 88 and 90. The input terminals of the OR gate 236 are connected to the leads 92 and 94.

The output terminals of the OR gates 230–236 are individually connected to an input terminal of respective AND gates 238–246 via respective leads 248–254. The output terminals of the AND gates 238–246 are connected to the respective OR gates 196–202 by respective leads 247, 249, 251, 253. The other input terminals of each one of the AND gates 238–246 are connected together and to the output terminal of the OR gate 224 by a lead 256.

When the brush 102 engages a J segment of one of the sets of contacts comprising the group 22 of contacts, a signal will be produced on one of the leads 212–218 to indicate in binary code the particular decade contact engaged by the brush 102. As the brush 102 moves from the J contact to the A contact of the next succeeding set of contacts, the brush 104 engages the decade contact in the group 24 of contacts to maintain the binary coded decade quantity at the output of the leads 212–218. To be more specific, when the brush 102 engages the contact 26J, for example, which represents the decade value ten, a signal will be applied to the lead 52 thereby causing a signal to appear at the output of the OR gate 172. If it is assumed that no input signal is applied to the NAND gate 220, the signal appearing on the lead 188 which is connected to the output terminals of the OR gate 172 will pass through the AND gate 180 and cause an output signal to appear on the lead 212 which is connected to the output terminals of the OR gate 196. Accordingly, a signal appearing on the lead 212 will indicate the decade value 10 in binary notation.

When the pressure increases to 11 percent of its maximum value, the brush 102 will engage the contact 28A. Additionally, the brush 104 will engage the contact 72 in the group 24 since the leading edge of the contact 72 is spaced behind the leading edge of the contact 26J by half the width of the contact 26J, as noted above. Thus, a signal will be applied to the lead 78 which is connected to the contact 72 thereby causing an output signal to appear on the lead 248 via the OR gate 230. At this point it is to be noted that the OR gate 224 will produce an output signal when the brush 102 is in engagement with any one of the contacts A through I. That is, since one terminal of the OR gate 224 is connected to the lead 122, it is obvious that the OR gate 224 will produce a signal whenever the brush 102 is in contact with an odd numbered segment. Additionally, since the OR gate is connected to each one of the leads 162–166, it is also obvious that the OR gate will produce an output signal if the brush 102 is in engagement with any one of the even numbered contacts. Thus, all of the AND gates 238–246 will be enabled when the brush 102 is in engagement with any one of the contacts in a set of contacts representing the units 1–9.

Accordingly, in the example under consideration, wherein the brush 104 is in engagement with the contact 72, the signal appearing on the lead 248 will pass through the AND gate 238 to the lead 247. The signal will pass through the OR gate 196 to maintain an output signal on the lead 212 as the brush 102 sweeps through the contacts 28A–28I.

The leading edge of a J contact in each set of contacts is engaged by the brush 102 prior to the engagement of the brush 104 with the leading edge of the corresponding one of the decade contacts comprising the group 24 to insure no errors are introduced into the system. That is, when the brush 104 is positioned between contacts comprising the group 24, the brush 102 will be in engagement with a J contact in a set of contacts thereby insuring that an output signal appears on one of the leads 212–218.

Similarly to the arrangement noted above with respect to eliminating errors due to multiple signals occurring in the unit group 22 of contacts, the NAND gate 220 and the associated AND gates eliminate any possibility of errors. That is, the OR gate 224 will produce a signal when the brush 102 is in engagement with any one of the A through I contacts in a set of contacts, as noted above. Accordingly, the NAND gate 220 will produce a signal at its output terminals which will disable the AND gates 180–186. Thus, when the brush 102 engages an I contact in a set of contacts corresponding to the nine unit and the J contact in the set of contacts corresponding to the decade value, the apparatus 10 will still indicate the nine value since the gates 180–186 remain disabled. In fact, the gates 180–186 are only enabled when the brush 102 is in engagement only with a J contact. Additionally, when the brush 102 is in engagement with a J contact it will be noted that the AND gates 238–246 will be disabled. That is, when the brush 102 is in engagement with a J contact in a set of contacts comprising the group 22, no output signal will appear at the OR gate 224 thereby disabling the AND gates 238–246. This insures that no multiple signals will appear on the leads 212–218 due to signals simultaneously applied to the matrices 170 and 228.

As noted above, the apparatus 10 is operable to indicate percentage changes in the parameter which is to measured in one-half percentage increments. The one-half incremental changes are measured by the group 20 of contacts noted hereinabove. Since alternate ones of the sets of contacts comprising the group 20 are connected together, for ease of reference the group 20 are divided into X and Y contacts wherein all of the 20X contacts are connected to the lead 98 and all of the contacts 20Y are connected to the lead 96. The lead 96 is connected to an input terminal of an AND gate 256 and the lead 98 is connected to an input terminal of an AND gate 258. The other input terminal of the gate 256 is connected to the lead 122 by a lead 260. On the other hand, the other input terminal of the gate 258 is connected to the output terminal of NAND gate 160 by a lead 262.

The output terminals of gates 256 and 258 are connected to both input terminals of OR gates 264 and 266 by leads 268 and 270, respectively. Leads 272 and 274 are connected to the output terminals of the respective gates 264 and 266 and may be connected to the binary to decimal encoder 168 so that the encoder will indicate one-half unit changes in the output thereof.

The Y contacts in the group 20 are associated with the contacts in the group 22 representing odd unit values. On the other hand, the X contacts in the group 20 are associated with the contacts in the group 22 of contacts which represent even numbered units. As shown in the FIGURE, the leading edge of the contacts 20X and 20Y are positioned substantially behind the leading edge of the associated unit contacts in the group 22 of contacts. That is, the leading edge of the first contact 20Y in the group 20 is positioned behind the leading edge of the contact 26A by substantially half the width of the contact. Moreover, the width of the contact 20B is substantially equal to half the width of corresponding unit contact in the group 22. Similar comments apply for the remainder of the contacts 20X and 20Y in the group 20.

The leading edge of the brush 100 is substantially coplanar with the leading edge of the brush 102 which engages the contacts in the group 22 of contacts. Hence, it will be obvious that as the brush 102 sweeps across the rear half of any one of the contacts in the group 22 of contacts, the brush 100 will engage and sweep across the associated contact in the group 20 of contacts.

It is to be noted that when the brush 102 is in engagement with a contact in the group 22 representing an even numbered value such as contact 26B which represents the unit two, the NAND gate 160 will produce an output signal and apply the same to the input terminal of the gate 258 via the lead 262 to enable the gate. Thus, as the brush 100 then engages the contact 20X associated with the contact 26B, the second input terminal of the AND gate 258 will be energized and, accordingly, a signal will appear on the output lead 270. Thus, signals will similarly appear on the leads 272 and 274 to indicate that the value of the parameter being measured has increased a half unit. At this point, the AND gate 256 will be disabled in view of the fact that no input signal is applied to the lead 260.

On the other hand, if the brush 102 is in engagement with a contact representing an odd-numbered unit, a signal will appear on the lead 122 thereby disabling the AND gates 258 via the NAND gate 160 and enabling the AND gate 256 via the lead 260. When the brush 100 now engages the associated contact 20X of the group 20 of contacts, both input terminals to the AND gate 256 will be enabled to produce an output signal on the leads 272, 274.

Accordingly, an apparatus has been disclosed for representing the value of a variable parameter in a digital code in an accurate and reliable manner.

While a preferred embodiment of the invention has been shown and described herein, it will be obvious that numerous omissions, changes and additions may be made in such embodiment without departing from the spirit and scope of the present invention.

What is claimed is:

1. Apparatus for converting the values of a variable parameter into corresponding unique electrical signals comprising a first plurality of contacts comprising at least a first and a second set of contacts, a movable member engageable with said plurality of contacts for applying a potential thereto, converting means responsive to said variable parameter for converting the value of said parameter into a corresponding position of said movable member, and circuit means connected with said plurality of contacts for producing a different electrical signal as each one of said plurality of contacts is engaged by said movable member, said circuit means comprising blocking means for blocking all but one of the electrical signals produced in response to said movable member simultaneously engaging more than one of said plurality of contacts, said circuit means further comprising a first generating means connected to said first set of contacts for producing respective electrical signals representative of the contacts in said first set of contacts engaged by said movable member, and a second generating means connected to said second set of contacts for producing respective electrical signals representative of the contacts in said second set engaged by said movable member, said blocking means comprising gate means connected between said first and second generating means and responsive to said signals produced by said first generating means for preventing the production of signals by said second generating means, and a second plurality of contacts representing one-half unit increments in the value of the parameter, lead means for connecting alternate ones of said second plurality of contacts together to provide a first and second group of said second plurality of contacts wherein each one of said first group of said second plurality of contacts is associated with a respective one of said first set of said first plurality of contacts and each one of said second group of said second plurality of contacts is associated with a respective one of said set of said first plurality of contacts, said circuit means further comprising third generating means connected to said first group of said second plurality of contacts for generating a signal in response to the engagement of said movable member with a contact in said first group, and fourth generating means for generating a signal in response to the engagement of said movable member with a contact in said second group, said blocking means further comprising first disabling means responsive to signals produced by said first generating means for preventing the generation of signals by said fourth generating means, and a second disabling means responsive to signals produced by said second generating means to preventing the generation of signals by said third generating means.

2. Apparatus as in claim 1, in which said second plurality of contacts are sized and positioned to be engaged by said moveable member simultaneously with the engagement of said movable member with the rear half of each one of said contacts comprising said first plurality of contacts.

* * * * *